United States Patent [19]
Lohlein et al.

[11] Patent Number: 4,845,676
[45] Date of Patent: Jul. 4, 1989

[54] NON-CLOCKED STATIC MEMORY CELL

[75] Inventors: Wolf-Dieter Lohlein, Herrenberg; Helmut Schettler, Dettenhausen; Otto Wagner, Altdorf, all of Fed. Rep. of Germany

[73] Assignee: International Business Machines Corporation, Armonk, N.Y.

[21] Appl. No.: 14,886

[22] Filed: Feb. 13, 1987

[30] Foreign Application Priority Data

Feb. 21, 1986 [EP] European Pat. Off. ........ 86102277.0

[51] Int. Cl.$^4$ .................... G11C 7/00; G11C 11/40
[52] U.S. Cl. ........................... 365/154; 365/156; 365/189.05; 365/190
[58] Field of Search ............... 365/154, 156, 189, 190

[56] References Cited

U.S. PATENT DOCUMENTS

| | | | |
|---|---|---|---|
| 4,262,340 | 4/1981 | Sasaki et al. | 365/154 |
| 4,380,055 | 4/1983 | Larson | 365/154 |
| 4,499,558 | 2/1985 | Mazin et al. | 365/182 |
| 4,527,255 | 7/1985 | Keshtbod | 365/154 |
| 4,653,025 | 3/1987 | Minato et al. | 365/154 |
| 4,654,823 | 3/1987 | Charransol et al. | 365/154 X |

FOREIGN PATENT DOCUMENTS

| | | | |
|---|---|---|---|
| 0085436 | 8/1983 | European Pat. Off. | 365/154 |
| 1285534 | 1/1987 | U.S.S.R. | 365/154 |

OTHER PUBLICATIONS

R. H. Linton et al., "Low-Power FET Storage Cell," *IBM Technical Disclosure Bulletin*, vol. 17, No. 11, Apr. 1975, pp. 3338-3339.

U. Baitinger et al., "Monolithic Storage Cell with FET's," *IMB Technical Disclosure Bulletin*, vol. 14, No. 12, May 1972, pp. 3640-3641.

*Primary Examiner*—Terrell W. Fears
*Assistant Examiner*—Alyssa H. Bowler
*Attorney, Agent, or Firm*—Stephen J. Limanek

[57] ABSTRACT

A static memory cell comprising a pair of cross-coupled transistors and a bit line driver/isolation stage configured as an inverter disposed between one node of the cross-coupled transistors and a read-select transistor. The cell is accessed through a bus which includes a read bit line and a write bit line, the word line being divided into a write word line and a read word line.

17 Claims, 3 Drawing Sheets

NON-CLOCKED STATIC MEMORY CELL

TECHNICAL FIELD

The invention relates to random access memory (RAM) cells, in particular fully static, non-clocked memory cells, as are used in static integrated memory arrays, comprising addressing by word and bit lines and the associated read circuits.

BACKGROUND ART

In practice, a distinction is made between dynamic, clocked static and non-clocked static memory cells. Dynamic memory cells consume a minimum of space and thus are easy to produce at low cost. A disadvantage is, however, that refresh cycles have to be performed within a rigid time pattern. Typical applications of such cells are main memories of computer systems and video refresh buffers of high-resolution graphic displays. For such applications, the periodically recurring refresh cycles can easily be masked. Where this is not possible, as, for instance, in cache, direct-look-aside table (DLAT) or data local store (DLS) memories, clocked static or non-clocked static cells, that are much more elaborate, have to be used.

Cache memories, containing portions of the main program that are currently processed by a central processing unit (CPU), are used as high-speed buffers between the slower main memory of a computer system and the CPU. Although their capacity is limited in most cases, such memories must be very fast and access to them should not be interrupted by refresh cycles, etc. As the CPU directly communicates with the cache memories, the data processing speed is directly dependent on the latter. In state-of-the-art microprocessor designs, such memories are frequently integrated on the chip (embedded arrays), so that, in addition to the access time, the power requirements are a critical parameter. DLAT memories, which are often organized to have a large word length but a limited capacity, contain the conversion tables employed in virtual storage concepts for generating the physical addresses. As DLAT memories are used to compute both the cache and the main memory addresses, the data processing speed of the CPU is directly dependent on them. The same holds for DLSs storing the microcode for instruction generation.

As clocked static memories, viewed from the periphery, have to be controlled within a rigid time pattern (requiring, for example, signals indicating when addresses and data are stable), the use of memories with non-clocked static cells is indispensable for many applications, such as the above-mentioned embedded arrays in complex very large scale integrated (VLSI) chips. Save for the finite access time, the operation of the latter type of memories is not limited with respect to time characteristics.

Non-clocked static memory cells are known. IBM Technical Disclosure Bulletin, Vol. 17, No. 11, April 1975, pp. 3338-3339, describes the concept of a non-clocked static memory cell realized as a 6-transistor CMOS cell with two bit lines and one word line.

A memory array thus designed has the disadvantage that DC current is drawn by all cells of a selected word line. A further DC current path extend across the sense amplifier. Therefore, a memory array designed to that circuit concept has high power requirements compared with clocked memory arrays, particularly if the word length is large, i.e., if a large number of cells are associated with one word line.

Because of the low gain factor of differential field effect transistor (FET) amplifiers, a two-stage sense amplifier is required for reading the memory content, thus leading to increased access times.

A further disadvantage of known circuit concepts, also with respect to clocked static memories, is the risk of double selection of memory cells in response to address changes, and of erroneous changes of the cell content under the influence of the bit line capacity, which has to be remedied in each case by additional peripheral circuits.

An embodiment of a non-clocked static memory cell preventing "cross-talk" between the bit line and the cell is described by U. Baitinger et al, in IBM Technical Disclosure Bulletin, Vol. 14, No. 12, 1972, pp. 3640-3641. However, that concept does not solve the problem of high power requirements and slow sense amplifiers.

DISCLOSURE OF THE INVENTION

It is an object of this invention to provide a non-clocked static memory cell which eliminates the above-described disadvantages, such as, high power requirements of all cells of a selected word line, long access times resulting from elaborate sense amplifiers, the risk of double selection, and erroneous changes of the cell content under the influence of the bit line capacity.

According to the teachings of this invention, an additional bit line driver/ isolation means is provided in the cells, such as the above-mentioned prior art 6-transistor cells. Further aspects of the invention include a simpler data-out driver stage in lieu of a sense amplifier and replacement of the bit line pair by a bus comprising a read bit line (BLR) and a write bit line (BLW).

The invention has the advantage that since the cell is isolated from the bus by the bit line driver/isolation stage, the cells of a selected word line require no power in addition to the standby current. By dividing the bit line pair into a read bit line (BLR) and a write bit line (BLW) and by decoupling the cell nodes from the bit line via the bit line driver or isolation stage, double selection of cells and cross-talk between the read bit line (BLR) and the cell are eliminated. Also eliminated are precharge transistors for the bit lines. As the sense amplifier is replaced by a data-out stage, the access time is reduced.

By eliminating peripheral circuits and simplifying the sense amplifier, one of which is required for each bit line pair and which particularly for large word length memory arrays involves considerable expenditure, the extra cost resulting from the additional bit line driver and isolation stage for each cell is largely compensated.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
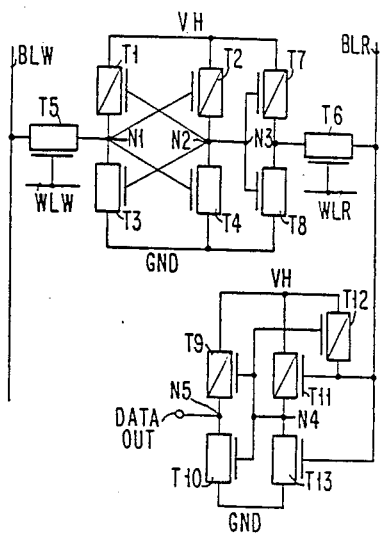
FIG. 1 shows a memory cell according to the invention designed in complementary metal oxide semiconductor (CMOS) technology with an integrated bit line drive/isolation stage, as well as the data-out driver of a read bit line.
Figure 2:
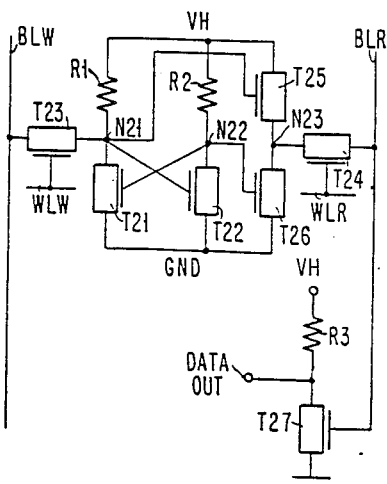
FIG. 2 shows the memory cell according to FIG. 1, but in N-channel metal oxide semiconductor (NMOS) technology.
Figure 5:
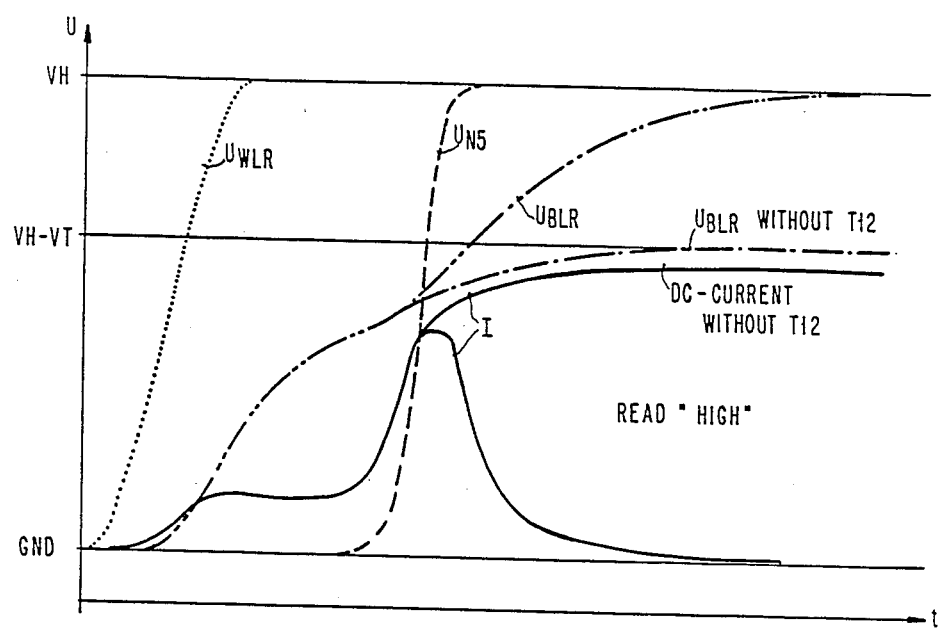
FIG. 5 is a timing diagram of a "high" level read operation with respect to a read bit line of the cell in FIG. 3.

Referring to FIG. 1 of the drawing in more detail, a cell in the CMOS version includes a bistable switch circuit, hereafter referred to as a flip-flop, which in this embodiment is made up of four cross-coupled transistors T1, T2, T3 and T4. The two nodes N1 and N2 of the flip-flop are connected through further switch elements, or transistors, T5 and T6 to a bus including a write bit line BLW and a read bit line BLR, respectively. Through transistor T5, used as in input/output (I/O) switch element, node N1 is connected to one of the bus lines, i.e., the write bit line BLW. In accordance with this invention, node N2 is linked to a specific bit line driver/isolation stage including two transistors T7 and T8 which are connected as an inverter. The node N3 of the inverter is linked to one of the bus lines, i.e., the read bit line BLR, through a further I/O switch element, transistor T6. As a result of the additional bit line driver/isolation stage, a bit line load device is no longer required, thus preventing a parasitic DC path in all cells along a selected word line. Such a path would lead via transistor T6 into node N2. Additionally, a partial trade-off is obtained between the area required for T7 and T8 and that saved in the layout of T1, T2, T3 and T4. These devices are no longer subject to design restrictions and can be reduced to minimum design values. Transistor T5 serves to select a particular cell during writing and transistor T6 serves to select a cell during reading. Transistor T5 is gated by a write word line WLW and transistor T6 is gated by a read word line WLR. The status of the read bit line BLR is fed to peripheral circuits via a data-out stage which in the embodiment takes the form of a driver stage that includes two cascaded inverter stages comprising transistors T9, T10 and T11, T13, and a further switch element, transistor T12, gated from node N4 of the bit line driver or isolation stage. Of the two gated electrodes of transistor T12, one is connected to the supply voltage VH and the other to the read bit line BLR. During "high" level reading of a selected cell (the potential being referred to read bit line BLR), transistor T12 charges the read bit line BLR to the potential of the supply voltage VH, as the selected cell itself is only capable of charging the read bit line BLR to a potential of VH - VT, where VT is the threshold voltage of transistor T6. In that case, DC current would flow through transistors T11 and T13 of the first inverter stage of the data-out stage for as long as read bit line BLR is at a "high" level, as shown in FIG. 5. According to FIG. 2 of the drawings, a cell of the NMOS version includes a flip-flop which in this embodiment is made up of two cross-coupled transistors T21 and T22 and two resistors R1 and R2 which connect flip-flop nodes N21 and N22, respectively, to supply voltage VH. The two nodes N21 and N22 of the flip-flop are connected through further I/O switch elements T23 and T24 to the write bit line BLW and the read bit line BLR, respectively. Node N22 is linked to a specific bit line driver/isolation stage including two transistors T25 and T26 which have their controlled electrodes series-connected to the supply voltage VH and ground GND. Each of the two transistors T25 and T26 is controlled from an associated flip-flop node such that, depending upon the cell content, one of the transistors is in a low-ohmic state and the other in a high-ohmic state. In the embodiment of FIG. 2, transistor T25 is controlled from mode N21 and transistor T26 is controlled from node N22. Node N23 of transistors T25 and T26 is connected to the read bit line BLR through a further switch element, transistor T24. Transistor T23 selects a particular cell during writing and transistor T24 serves to select a cell during reading. Transistor T23 is gated by a write word line WLW and transistor T24 is gated by a read word line WLR. The status of the read bit line BLR is transferred via a data-out stage to peripheral circuits. The data-out stage, controlled by read bit line BLR, includes a switch, in this case a FET transistor T27 having one of its two gated electrodes connected to ground GND and the other through a resistor R3 to supply voltage VH.

Resistors R1 to R3 are preferably made of a polysilicon material, but may also take the form of FET transistors. If they are of the enhancement type, their gate is linked to the transistor electrode connected to supply voltage VH. Alternatively, if they are of the depletion type their gate is connected to the other electrode.

Writing and reading proceed in the same way for either cell version (CMOS and NMOS). During writing, transistor T5 in the CMOS version of FIG. 1, and transistor T23 in the NMOS version of FIG. 2, is switched to the conductive state by a suitable level (in these embodiments, a positive level) of the write word line WLW, and the potential corresponding to logic "low" or "high" is then adjusted by write bit line BLW at cell node N1, and at node N21 in the NMOS version. During reading, transistor T6 in the CMOS version, and transistor T24 in the NMOS version is switched to the conductive state by read word line WLR. Depending upon the cell content, the bit line driver or isolation stage, in the embodiment of the CMOS version, transistors T7 and T8, and in the NMOS version transistors T25 and T26, then charges the read bit line BLR to logic "low" or "high", the respective level being transmitted via the data-out stage, i.e., transistors T9 to T13 of the CMOS version, and transistor T27 with resistor R3 of the NMOS version, to peripheral circuits.

Figure 3:
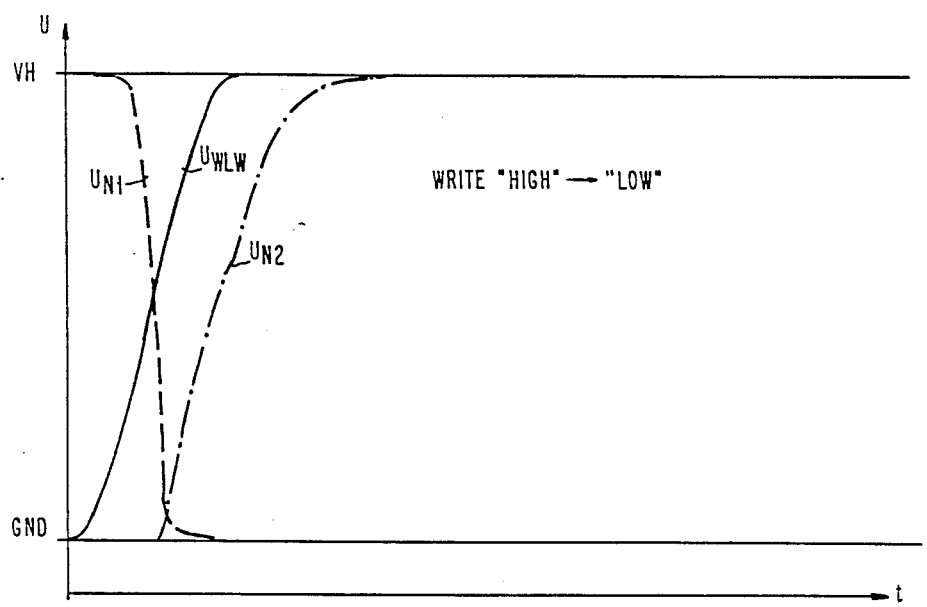
FIG. 3 is a timing diagram of a write operation from "high" to "low" with respect to a node of a cell in CMOS technology.

The voltage time diagram of FIG. 3 shows the voltage curves for a write operation from "high" to "low" (the potential being referred to node N1 in FIG. 1) initiated by the voltage change of the write word line WLW ($U_{WLW}$), the almost instantaneous response of node N1 ($U_{N1}$) and the slightly delayed response of node N2 ($U_{N2}$).

Figure 4:
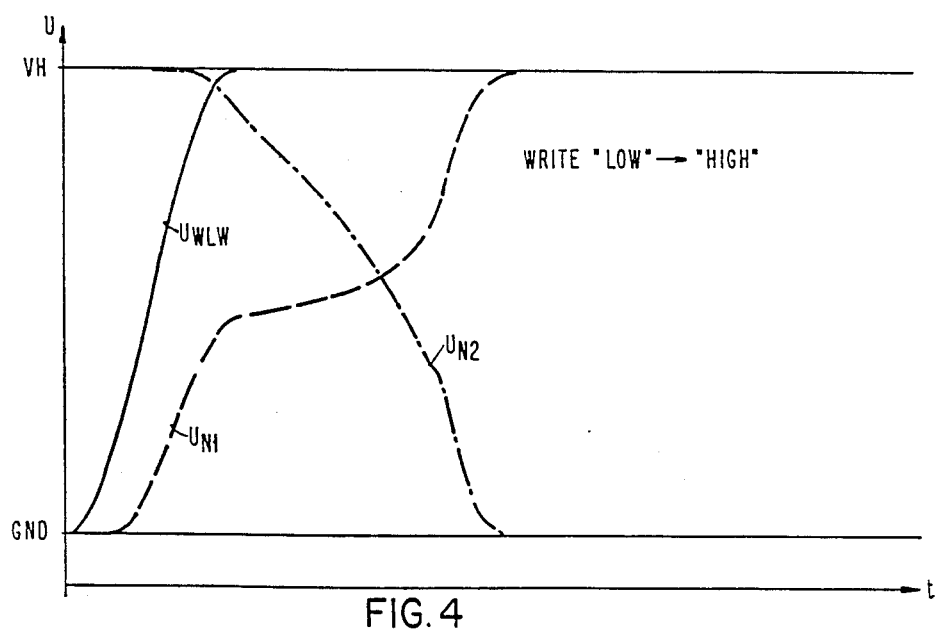
FIG. 4 is the timing diagram of FIG. 3, but with writing proceeding in the opposite direction.

The voltage time diagram of FIG. 4 shows the voltage curves for a write operation from "low" to "high" initiated by the voltage change of the write word line WLW ($U_{WLW}$) and, compared to FIG. 3, the slower responses at nodes N1 and N2 ($U_{N1}$ and $U_{N2}$). The steep rise after the drop at the center of the curve of $U_{N1}$ is caused by the feedback effect in the flip-flop.

The voltage time diagram of FIG. 5 shows the voltage curve (during "high" level reading with respect to read bit line BLR) of read word line WLR ($U_{WLR}$), the slow response of read bit line BLR ($U_{BLR}$) caused by the inherent capacitance, and the fast response at the output ($U_{N5}$) caused by the hysteresis characteristics of the data-out stage. Roughly at the center of the diagram, curve $U_{BLR}$ and curve I divide into two graphs showing the influence of transistor T12 in FIG. 1, the lower graph of the $U_{BLR}$ curve and the upper graph of the I curve depicting conditions that would exist in the absence of transistor T12. The voltage at the read bit line BLR ($U_{BLR}$) only rises to a value VH - VT, with a permanent current flowing. The other two graphs show how read bit line BLR is charged by transistor T12 to supply voltage VH and how, in response, the current intake is reduced to a negligible value.

Figure 6:
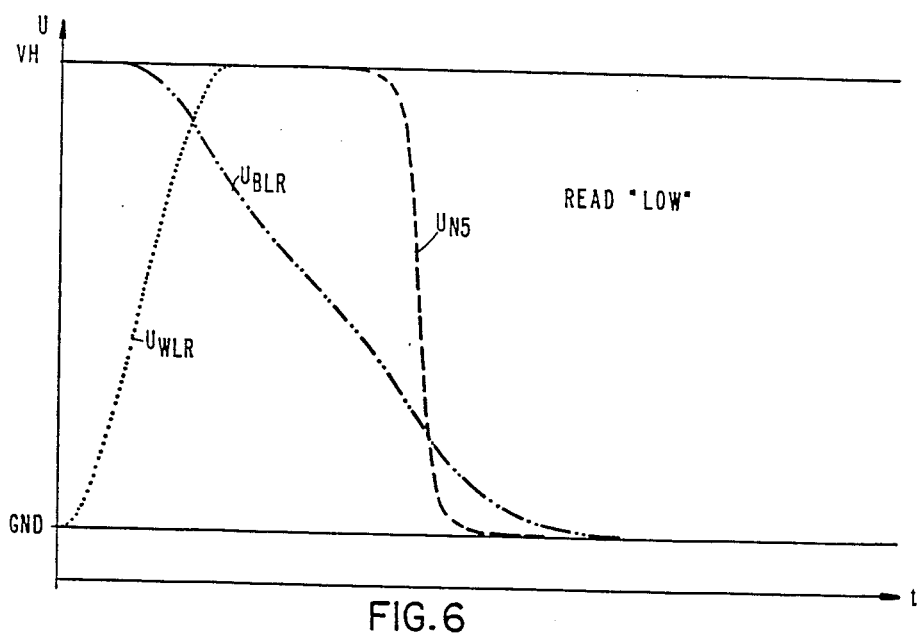
FIG. 6 is the timing diagram of FIG. 5, but for a "low" level read operation with respect to a read bit line.

Similar to FIG. 5, the voltage time diagram of FIG. 6 shows the voltage curve (during "low" level reading with respect to read bit line BLR) of read word line WLR ($U_{WLR}$) and, as in FIG. 5, the slow response of the read bit line BLR ($U_{BLR}$) and the fast response at the output of the data-out stage ($U_{N5}$).

While the invention has been particularly shown and described with reference to preferred embodiments thereof, it will be understood by those skilled in the art that various changes in form and details may be made therein without departing from the spirit and scope of the invention.

What is claimed is:

1. A non-clocked static memory cell circuit comprising
   a flip-flop having cross-coupled switch devices and load devices coupled thereto forming internal cell nodes,
   bit lines,
   controllable input/output switch elements interposed between said bit lines and said nodes, and
   a bit line driver/isolation stage disposed between one of said cell nodes and one of said input/output switch elements and having an input connected to said one cell node and an output connected to said one input/output switch element, each of said switch devices being an N-type field effect transistor and said bit line driver/isolation stage including an N-type field effect transistor and said load devices being P-type field effect transistors.

2. A non-clocked static memory cell circuit comprising
   a flip-flop having cross-coupled switch devices and load devices coupled thereto forming internal cell nodes,
   bit lines,
   controllable input/output switch elements interposed between said bit lines and said nodes, and
   a bit line driver/isolation stage disposed between one of said cell nodes and one of said input/output switch elements and having an input connected to said one cell node and an output connected to said one input/output switch element, said bit line driver/isolation stage including an additional load device and each of said load devices being a P-channel field effect transistor.

3. A non-clocked static memory cell circuit as set forth in claim 2 wherein the width to length ratio of each of said load devices of said flip-flop is smaller than that of said additional load device.

4. A non-clocked static memory cell circuit as set forth in claim 3 wherein the width to length ratio of said load device of said bit line driver/isolation stage is determined by desired requirements for charging said bit line associated with said one of said input/output switch elements.

5. A non-clocked static memory cell circuit as set forth in claim 2 wherein said P-type field effect transistors are arranged in parallel and connected to a voltage supply.

6. A non-clocked static memory cell circuit comprising
   a flip-flop having cross-coupled switch devices and load devices coupled thereto forming internal cell nodes,
   bit lines,
   controllable input/output switch elements interposed between said bit lines and said nodes,
   a bit line driver/isolation stage disposed between one of said cell nodes and one of said input/output switch elements and having an input connected to said one cell node and an output connected to said one input/output switch element, and
   a bit line data-out driver having two cascaded inverters and a bit line clamp-up P-channel field effect transistor, said transistor having one gated electrode connected to a higher potential of a supply voltage and having another gated electrode connected to one of said bit lines, and gated from the output of one of said inverters.

7. A non-clocked static memory cell circuit as set forth in claim 6 wherein said one of said inverters has an input connected to said one of said bit lines.

8. A memory comprising
   first and second cross-coupled transistors,
   first and second load elements connected serially with said first and second transistors, respectively, forming first and second nodes at common points between said transistors and said load elements,
   a write bit line,
   a read bit line,
   first and second transfer devices, said first transfer device coupling said write bit line to said first node and said second transfer device being interposed between said second node and said read bit line, and
   an inverter having an input coupled to said second node and an output coupled to said second transfer device.

9. A memory comprising
   first and second cross-coupled transistors,
   first and second load elements connected serially with said first and second transistors, respectively, forming first and second nodes at common points between said transistors and said load elements,
   a write bit line,
   a read bit line,
   first and second transfer devices, said first transfer device coupling said write bit line to said first node and said second transfer device being interposed between said second node and said read bit line, and
   an inverter having an input coupled to said second node and an output coupled to said second transfer device, each of said transistors being an N-channel field effect transistor, each of said load elements being a P-channel field effect transistor, said inverter including a P-channel field effect transistor and an N-channel field effect transistor, and each of said transfer devices being an N-channel field effect transistor.

10. A memory comprising
first and second cross-coupled transistors,
first and second load elements connected serially with said first and second transistors respectively, forming first and second nodes at common points between said transistors and said load elements,
a write bit line,
a read bit line,
first and second transfer devices, said first transfer device coupling said write bit line to said first node and said second transfer device being interposed between said second node and said read bit line, and
an inverter having an input coupled to said second node and an output coupled to said second transfer device, each of said transistors being an N-channel field effect transistor, each of said load elements being a polysilicon resistor, said inverter including serially arranged N-channel field effect transistors and each of said transfer devices being an N-channel field effect transistor.

11. A memory comprising
first and second cross-coupled transistors,
first and second load elements connected serially with said first and second transistors respectively, forming first and second nodes at common points between said transistors and said load elements,
a write bit line,
a read bit line,
first and second transfer devices, said first transfer device coupling said write bit line to said first node and said second transfer device being interposed between said second node and said read bit line,
an inverter having an input coupled to said second node and an output coupled to said second transfer device, and
a data out driver including
a data out terminal,
first and second inverters, said first inverter having an input connected to said read bit line and an output connected to an input of said second inverter and said second inverter having an output connected to said data out terminal, and
a clamp-up device connected between said read bit line and a source of reference potential and having a control electrode.

12. A memory as set forth in claim 11 wherein each of said inverters is of the complementary metal oxide semiconductor (CMOS) type and said clamp-up device is a P-channel field effect transistor.

13. A memory comprising
first and second cross-coupled transistors,
first and second load elements connected serially with said first and second transistors respectively, forming first and second nodes at common points between said transistors and said load elements,
a write bit line,
a read bit line,
first and second transfer devices, said first transfer device coupling said write bit line to said first node and said second transfer device being interposed between said second node and said read bit line,
an inverter having an input coupled to said second node and an output coupled to said second transfer device, and
a data out driver including
a data out terminal,
an inverter having an input connected to said read bit line and an output connected to said data out terminal.

14. A memory as set forth in claim 13 wherein said inverter includes an N-channel field effect transistor and a resistor serially connected with said N-channel field effect transistor to form a common point, said inverter having an input connected to said read bit line and said common point being connected to said data out terminal.

15. A non-clocked static memory cell circuit comprising
a flip-flop having cross-coupled switch devices and load devices coupled thereto forming first and second internal cell nodes,
first and second bit lines,
first and second controllable input/output switch elements, said first switch element being interposed between said first bit line and said first node, and
a bit line driver/isolation stage disposed between said second cell node and said second input/output switch element and having an input connected to said second cell node and an output connected to said second input/output switch element, said second input/output switch element being connected between said stage and said second bit line.

16. A non-clocked static memory cell circuit comprising
a flip-flop having cross-coupled switch devices and load devices coupled thereto forming internal cell nodes,
bit lines,
controllable input/output switch elements interposed between said bit lines and said nodes, and
a bit line driver/isolation stage disposed between one of said cell nodes and one of said input/output switch elements and having an input connected to said one cell node and an output connected to said one input/output switch element, said bit line driver/isolation stage being an inverter.

17. A non-clocked static memory cell circuit comprising
a flip-flop having cross-coupled switch devices and load devices coupled thereto forming internal cell nodes,
bit lines,
controllable input/output switch elements interposed between said bit lines and said nodes, and
a bit line driver/isolation stage disposed between one of said cell nodes and one of said input/output switch elements and having an input connected to said one cell node and an output connected to said one input/output switch element, said bit line driver/isolation stage being a push-pull driver stage having serially arranged N-channel field effect transistors.

* * * * *